United States Patent
Kramer et al.

(10) Patent No.: US 8,446,561 B2
(45) Date of Patent: May 21, 2013

(54) LITHOGRAPHIC APPARATUS AND A METHOD OF MEASURING FLOW RATE IN A TWO PHASE FLOW

(75) Inventors: Pieter Jacob Kramer, Veldhoven (NL); Antonius Johannus Van Der Net, Tilburg (NL); Erik Henricus Egidius Catharina Eummelen, Eindhoven (NL); Anthonie Kuijper, Best (NL)

(73) Assignee: ASML Netherlands B.V., Veldhoven (NL)

( * ) Notice: Subject to any disclaimer, the term of this patent is extended or adjusted under 35 U.S.C. 154(b) by 349 days.

(21) Appl. No.: 12/820,448

(22) Filed: Jun. 22, 2010

(65) Prior Publication Data

US 2011/0013159 A1    Jan. 20, 2011

Related U.S. Application Data

(60) Provisional application No. 61/213,657, filed on Jun. 30, 2009.

(51) Int. Cl.
*G03B 27/52* (2006.01)
*G03B 27/42* (2006.01)

(52) U.S. Cl.
USPC ............................................. 355/30; 355/53

(58) Field of Classification Search
USPC ................... 355/30, 53, 77; 73/200, 861.04
See application file for complete search history.

(56) References Cited

U.S. PATENT DOCUMENTS

| | | | |
|---|---|---|---|
| 4,509,852 A | | 4/1985 | Tabarelli et al. |
| 5,535,632 A | * | 7/1996 | Kolpak ....................... 73/861.04 |
| 7,379,155 B2 | * | 5/2008 | Mertens et al. ................. 355/53 |
| 7,505,115 B2 | * | 3/2009 | Magome et al. ................ 355/53 |
| 7,942,065 B2 | * | 5/2011 | Xie ............................. 73/861.04 |
| 2004/0136494 A1 | | 7/2004 | Lof et al. |
| 2004/0207824 A1 | | 10/2004 | Lof et al. |
| 2005/0282405 A1 | * | 12/2005 | Harpham et al. ............. 438/795 |
| 2006/0038968 A1 | | 2/2006 | Kemper et al. |
| 2006/0082746 A1 | | 4/2006 | Mertens et al. |
| 2006/0119809 A1 | | 6/2006 | Verhagen et al. |
| 2006/0146305 A1 | | 7/2006 | Magome et al. |
| 2006/0158627 A1 | | 7/2006 | Kemper et al. |
| 2008/0212046 A1 | | 9/2008 | Riepen et al. |
| 2008/0307891 A1 | | 12/2008 | Raskie |
| 2009/0279060 A1 | | 11/2009 | Direcks et al. |

(Continued)

FOREIGN PATENT DOCUMENTS

| CN | 1737690 | 2/2006 |
|---|---|---|
| CN | 101213426 | 7/2008 |

(Continued)

OTHER PUBLICATIONS

Chinese Office Action dated May 28, 2012 in corresponding Chinese Patent Application No. 201010222695.X.

(Continued)

*Primary Examiner* — Hung Henry Nguyen
(74) *Attorney, Agent, or Firm* — Pillsbury Winthrop Shaw Pittman LLP (57) ABSTRACT

A lithographic apparatus is disclosed that includes a conduit for two phase flow therethrough. A flow separator is provided to separate the two phase flow into a gas flow and a liquid flow. A flow meter measures the flow rate of fluid in the gas flow or the liquid flow.

13 Claims, 5 Drawing Sheets

U.S. PATENT DOCUMENTS

| | | |
|---|---|---|
| 2009/0279062 A1 | 11/2009 | Direcks et al. |
| 2009/0296065 A1 | 12/2009 | Cloin et al. |
| 2010/0045950 A1 | 2/2010 | Kemper et al. |
| 2010/0060868 A1 | 3/2010 | Tanasa et al. |
| 2010/0157265 A1 | 6/2010 | Ten Kate |

FOREIGN PATENT DOCUMENTS

| | | |
|---|---|---|
| CN | 101436000 | 5/2009 |
| EP | 1420300 A2 | 5/2004 |
| JP | 2005-191344 | 7/2005 |
| JP | 2005-268742 | 9/2005 |
| JP | 2006-121078 | 5/2006 |
| JP | 2007-005830 | 1/2007 |
| JP | 2007-234821 | 9/2007 |
| JP | 2008-503079 | 1/2008 |
| JP | 2009-016404 | 1/2009 |
| JP | 2010-050454 | 3/2010 |
| JP | 2014-147466 | 7/2010 |
| KR | 10-2006-0052882 | 5/2006 |
| WO | 99/49504 | 9/1999 |
| WO | 2005/064405 A2 | 7/2005 |
| WO | 2007/083686 | 7/2007 |

OTHER PUBLICATIONS

Korean Office Action dated Jun. 29, 2011 in corresponding Korean Patent Application No. 10-2010-0062267.

Japanese Office Action mailed Mar. 28, 2012 in corresponding Japanese Patent Application No. 2010-142164.

Chinese Office Action dated Feb. 16, 2012 in corresponding Chinese Patent Application No. 201010222695.X.

U.S. Appl. No. 61/181,158, filed May 26, 2009.

* cited by examiner

Fig. 1

-- PRIOR ART --

Fig. 2

-- PRIOR ART --

Fig. 3

-- PRIOR ART --

Fig. 4

-- PRIOR ART --

LITHOGRAPHIC APPARATUS AND A METHOD OF MEASURING FLOW RATE IN A TWO PHASE FLOW

This application claims priority and benefit under 35 U.S.C. §119(e) to U.S. Provisional Patent Application No. 61/213,657, entitled "Lithographic Apparatus and a Method of Measuring Flow Rate in a Two Phase Flow", filed on Jun. 30, 2009. The content of that application is incorporated herein in its entirety by reference.

FIELD

The present invention relates to a lithographic apparatus and a method of measuring flow rate in a two phase flow.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

After exposure of a substrate in an immersion lithographic apparatus, the substrate table is moved away from its exposure position to a position in which the substrate may be removed and replaced by a different substrate. This is known as substrate swap. In a two stage lithographic apparatus, the substrate tables swap may take place under the projection system.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) is a form of immersion system arrangement. The arrangement requires that a large body of liquid should be accelerated during a scanning exposure. This may require additional or more powerful motors and turbulence in the liquid may lead to undesirable and unpredictable effects.

Another arrangement proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. This type of arrangement may be referred to as a localized immersion system arrangement.

PCT patent application publication WO 2005/064405 discloses another type of immersion system arrangement referred to the all wet arrangement in which the immersion liquid is unconfined. In such a system the whole top surface of the substrate is covered in liquid. This may be advantageous because then the whole top surface of the substrate is exposed to the substantially same conditions. This may have an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate W in all positions and which is arranged to have immersion liquid extending between it and the top surface of the substrate and/or substrate table which holds the substrate.

In an immersion apparatus, immersion fluid is handled by a fluid handling system, structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. The fluid handling system is located between the projection system and the substrate table. In reference to the aforementioned description, reference in this paragraph to a feature defined with respect to fluid may be understood to include a feature defined with respect to liquid.

In a fluid handling system or liquid confinement structure, liquid is confined to a space i.e. in an immersion space. For example within a confinement structure the liquid is confined by the body of the structure, the surface of the projection system and the underlying surface (e.g. a substrate table, a substrate supported on the substrate table, a shutter member and/or a measurement table). In the case of a localized area immersion system, the liquid is also confined in the immersion space by a liquid meniscus between the fluid handling system or liquid confinement structure and the underlying structure. In the case of an all wet system, liquid is allowed to flow out of the immersion space onto the top surface of the substrate and/or substrate table.

SUMMARY

An immersion lithographic apparatus often comprises one or more conduits with two phase flow therein. Two phase flow occurs, for example, where gas and liquid are removed through an opening simultaneously or one after the other. One example is an extractor which is used to control the position of a meniscus, for example the meniscus of liquid between the liquid confinement structure and the substrate. In order to operate the apparatus correctly, to safeguard the apparatus from flooding, for diagnostic reasons, etc. it is desirable to detect/measure two phase flow. Detecting two phase flow with a pressure sensor is difficult because the measured pressure depends on the exact gas-liquid ratio (e.g., gas to liquid ratio and/or liquid to gas ratio) in the two phase flow. Use of a pressure sensor does not yield information about the gas-liquid ratio.

It is therefore desirable, for example, to provide a system to detect flow in a two phase flow. It is desirable to provide a system to detect the gas-liquid ratio in the two phase flow.

In an aspect, there is provided a lithographic apparatus comprising: a conduit for two phase flow therethrough; a flow separator configured to separate the two phase flow into a gas flow and a liquid flow; and a flow meter configured to measure the flow rate of fluid in the gas flow and/or the liquid flow.

In an aspect, there is provided a method of measuring a flow rate in a two phase flow comprising: separating a two phase flow into a gas flow and a liquid flow; and using a flow meter to measure flow rate of fluid in the gas flow and/or the liquid flow.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
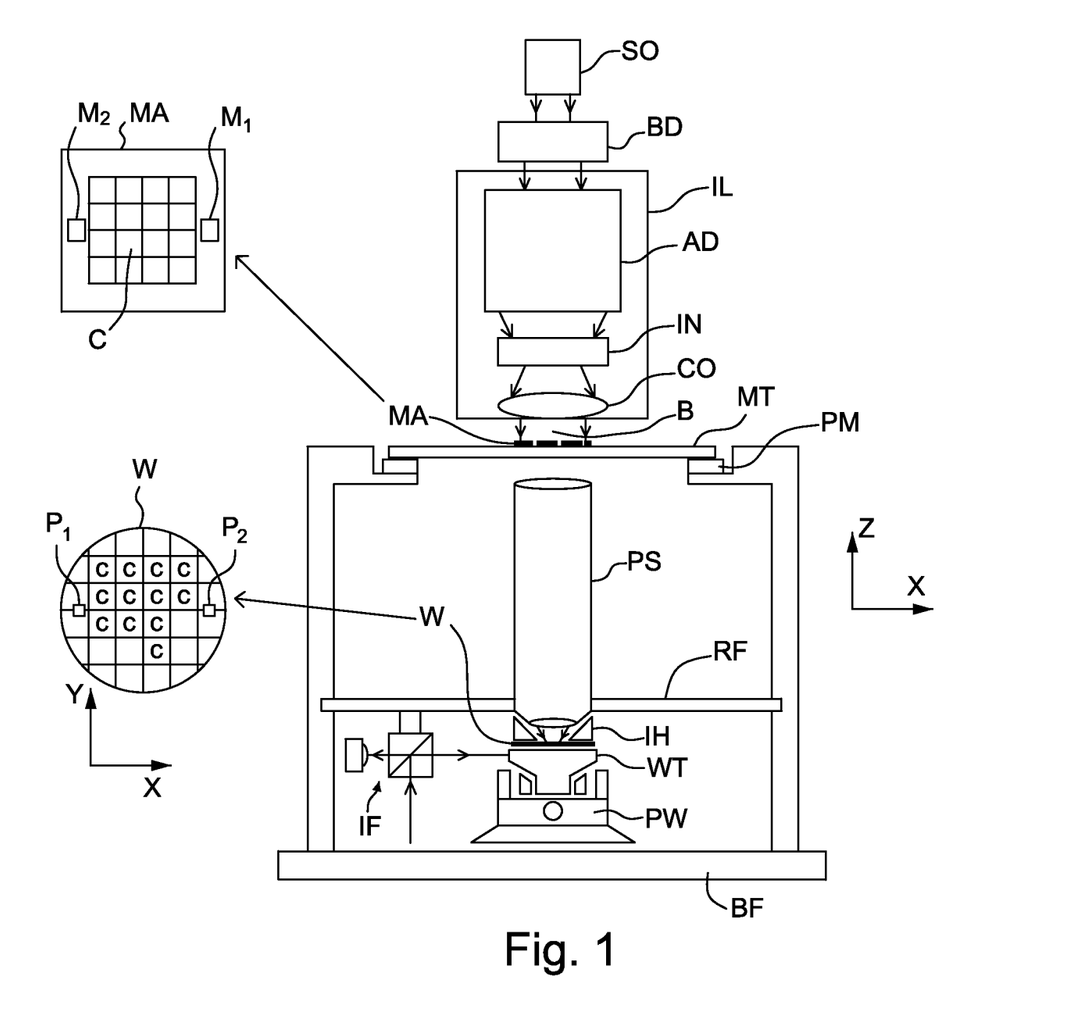
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device MA in accordance with certain parameters;
- a substrate table (e.g. a wafer table) WT constructed to hold a substrate (e.g. a resist-coated wafer) W and connected to a second positioner PW configured to accurately position the substrate W in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. The support structure MT holds the patterning device MA in a manner that depends on the orientation of the patterning device MA, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as desired. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system. The types of projection system may include: refractive, reflective, catadioptric, magnetic, electromagnetic and electrostatic optical systems, or any combination thereof. The selection or combination of the projection system is as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS. The projection system PS focuses the beam B onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

In another mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as desired after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

An arrangement to provide liquid between a final element of the projection system PS and the substrate is the so called localized immersion system IH. In this system a fluid handling structure is used in which liquid is only provided to a localized area of the substrate. The space filled by liquid is smaller in plan than the top surface of the substrate and the area filled with liquid remains substantially stationary relative to the projection system PS while the substrate W moves underneath that area. Four different types of fluid handling structure are illustrated in FIGS. 2-5.

Figure 2:
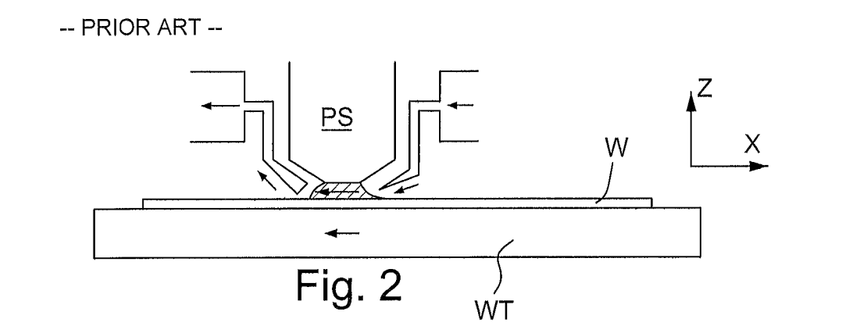
FIGS. 2 and 3 depict a fluid handling structure as a liquid supply system for use in a lithographic projection apparatus.
Figure 3:
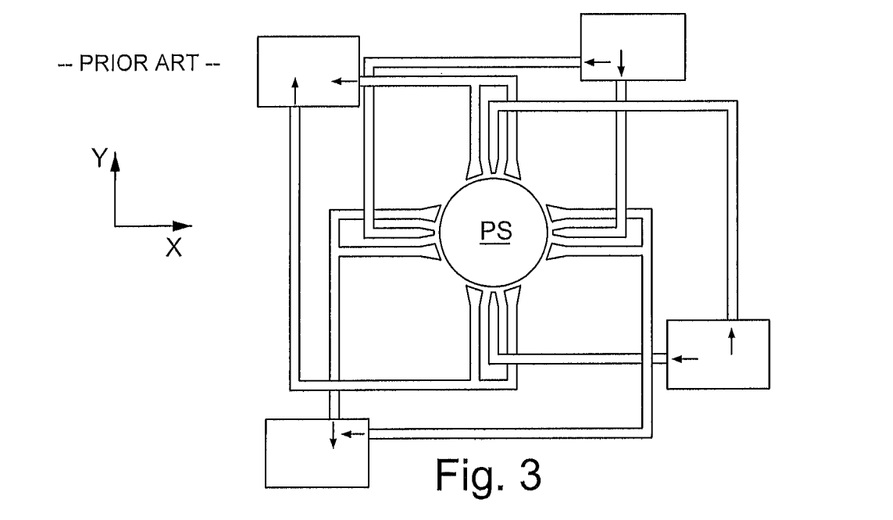

As illustrated in FIGS. 2 and 3, liquid is supplied by at least one inlet onto the substrate, preferably along the direction of movement of the substrate relative to the final element. Liquid is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

Figure 4:
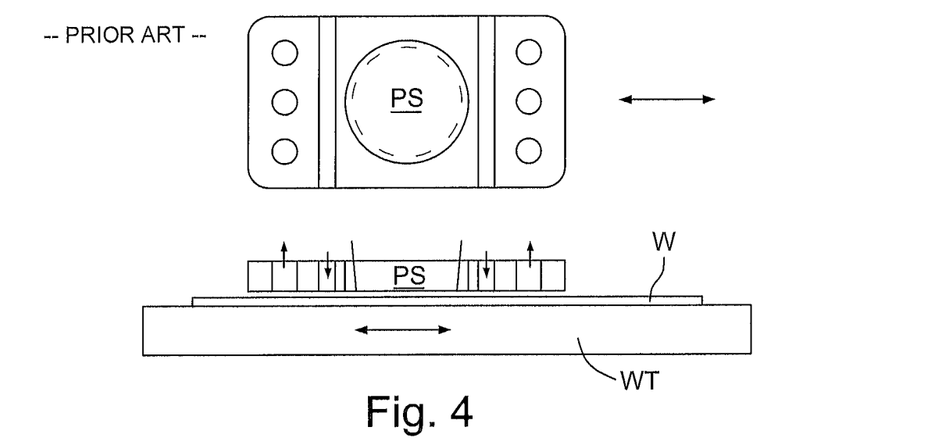
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in inlets and out of outlets.

Another arrangement which has been proposed is to provide the liquid supply system with a liquid confinement member which extends along at least a part of a boundary of the space between the final element of the projection system and the substrate table. Such an arrangement is illustrated in FIG. 5.

Figure 5:
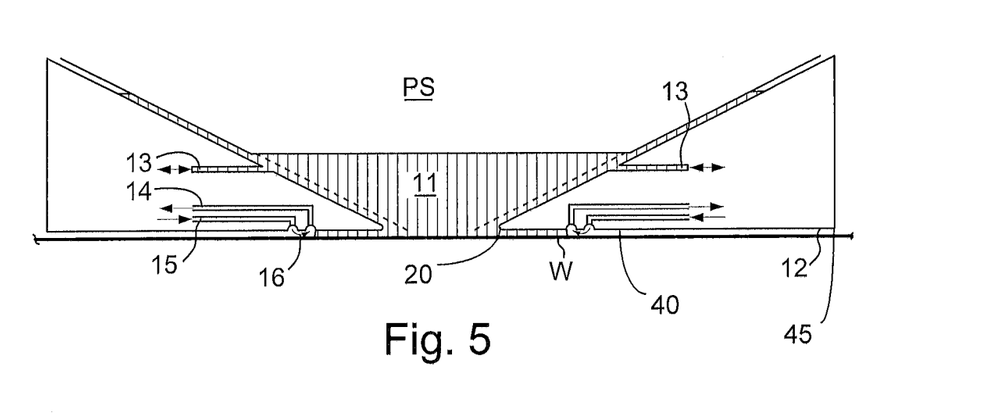
FIG. 5 depicts, in cross-section, a fluid handling structure.

FIG. 5 schematically depicts a localized liquid supply system with a fluid handling structure 12. The fluid handling structure 12 extends along at least a part of a boundary of the space 11 between the final element of the projection system PS and a facing surface which is desirably a substantially flat surface, e.g. the substrate table WT and/or the substrate W. (Please note that reference in the following text to surface of the substrate W also refers in addition or in the alternative to a surface of the substrate table WT, unless expressly stated otherwise.) The fluid handling structure 12 is substantially stationary relative to the projection system PS in the XY plane though there may be some relative movement in the Z direction (in the direction of the optical axis). In an embodiment, a seal is formed between the fluid handling structure 12 and the surface of the substrate W and may be a contactless seal such as fluid seal, desirably a gas seal. Such a system is disclosed in United States patent application publication no. US 2004-0207824, hereby incorporated in its entirety by reference.

The fluid handling structure 12 at least partly contains liquid in the immersion space 11 between a final element of the projection system PS and the substrate W. A contactless seal, such as a gas seal 16, to the substrate W may be formed in an undersurface 40 of the fluid handling structure 12 around the image field of the projection system PS so that liquid is confined within the space 11 between the substrate W surface and the final element of the projection system PS. Desirably the undersurface 40 is substantially parallel to the facing surface. The immersion space 11 is at least partly formed by the fluid handling structure 12 positioned below and surrounding the final element of the projection system PS. Liquid is brought into the space 11 below the projection system PS and within the fluid handling structure 12 by liquid inlet 13. The liquid may be removed by liquid outlet 13. The fluid handling structure 12 may extend a little above the final element of the projection system PS. The liquid level rises above the final element so that a buffer of liquid is provided. In an embodiment, the fluid handling structure 12 has an inner periphery that at the upper end closely conforms to the shape of the projection system PS or the final element thereof and may, e.g., be round. At the bottom, the inner periphery defined by an edge 20 of the undersurface 40 closely conforms to the shape of the image field, e.g., rectangular, though this need not be the case. The undersurface 40 has an outer edge 45 or rim.

The gas seal 16 is formed by gas, e.g. air or synthetic air but, in an embodiment, $N_2$ or another inert gas. The gas in the gas seal 16 is provided under pressure via inlet 15 to the gap between liquid confinement structure 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the fluid handling structure 12 and the substrate W contains the liquid in an immersion space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824.

Figure 6:
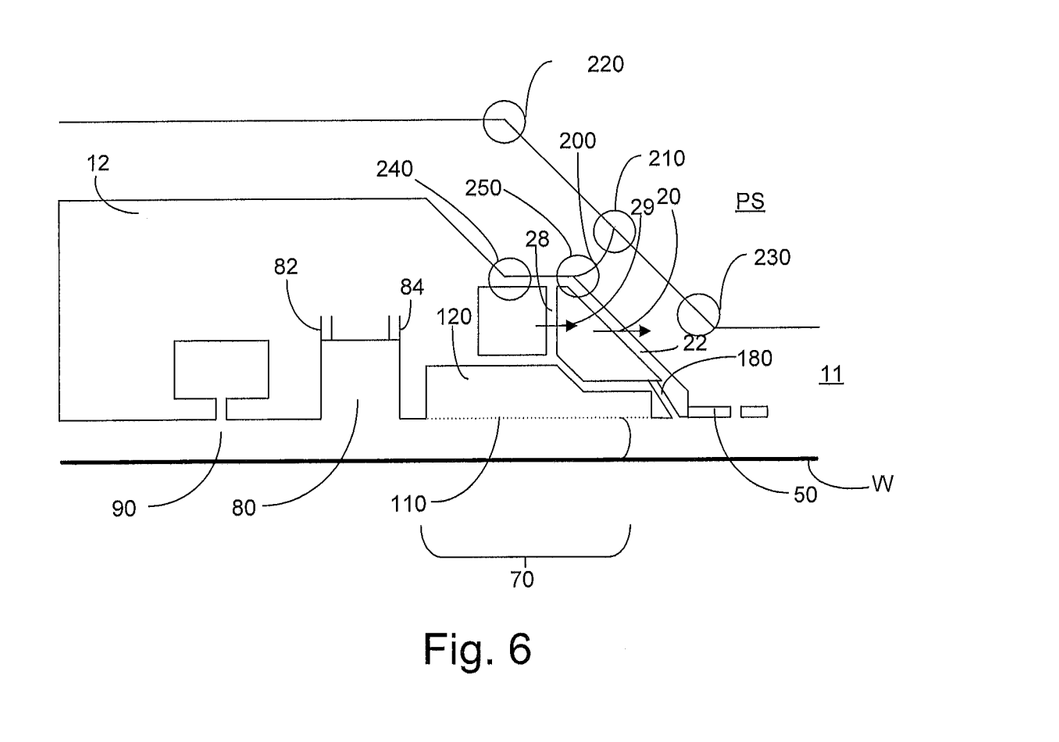
FIG. 6 depicts, in cross-section, a further fluid handling structure.

FIG. 6 illustrates an embodiment of a liquid confinement structure 12 which is part of a liquid supply system. The liquid confinement structure 12 extends around the periphery (e.g., circumference) of the final element of the projection system PS.

A plurality of openings 20 in a surface which defines the space 11 provide the liquid to the space 11. The liquid passes through openings 29, 20 in side walls 28, 22 respectively prior to entering the space 11.

A seal is provided between the bottom of the liquid confinement structure 12 and the substrate W. In FIG. 6 a seal device is configured to provide a contactless seal and is made up of several components. Radially outwardly from the optical axis of the projection system PS, there is provided a (optional) flow control plate 50 which extends into the space 11. Radially outwardly of the flow control plate 50 on the bottom surface of the liquid confinement structure 12 facing the substrate W or substrate table WT may be an opening 180. The opening 180 can provide liquid in a direction towards the substrate W. During imaging this may be useful in preventing bubble formation in the immersion liquid by filling a gap between the substrate W and substrate table WT with liquid.

Radially outwardly of the opening 180 may be an extractor assembly 70 to extract liquid from between the liquid confinement structure 12 and the substrate W and/or the substrate table WT. The extractor assembly 70 may operate as a single phase or as a dual phase extractor.

Radially outwardly of the extractor assembly 70 may be a recess 80. The recess 80 is connected through an inlet 82 to the atmosphere. The recess 80 is connected via an outlet 84 to a low pressure source. Radially outwardly of the recess 80 may be a gas knife 90. An arrangement of the extractor assembly, recess and gas knife is disclosed in detail in United States patent application publication no. US 2006/0158627 incorporated herein in its entirety by reference.

The extractor assembly 70 comprises a liquid removal device or extractor or inlet such as the one disclosed in United States patent application publication no. US 2006-0038968, incorporated herein in its entirety by reference. In an embodiment, the liquid removal device 70 comprises an inlet which is covered in a porous material 110 which is used to separate liquid from gas to enable single-liquid phase liquid extraction. An under pressure in chamber 120 is chosen is such that the meniscuses formed in the holes of the porous material 110 prevent ambient gas from being drawn into the chamber 120 of the liquid removal device 70. However, when the surface of the porous material 110 comes into contact with liquid there is no meniscus to restrict flow and the liquid can flow freely into the chamber 120 of the liquid removal device 70.

The porous material 110 has a large number of small holes each with a dimension, e.g. a width, such as a diameter, $d_{hole}$ in the range of 5 to 50 mm. The porous material 110 may be maintained at a height in the range of 50 to 300 mm above a surface from which liquid is to be removed, e.g. the surface of a substrate W. In an embodiment, porous material 110 is at least slightly liquidphilic, i.e. having a dynamic contact angle of less than 90°, desirably less than 85° or desirably less than 80°, to the immersion liquid, e.g. water.

Although not specifically illustrated in FIG. 6, the liquid supply system has an arrangement to deal with variations in the level of the liquid. This is so that liquid which builds up between the projection system PS and the liquid confinement structure 12 can be dealt with and does not spill. One way of dealing with this liquid is to provide a liquidphobic (e.g., hydrophobic) coating. The coating may form a band around the top of the liquid confinement structure 12 surrounding the opening and/or around the last optical element of the projection system PS. The coating may be radially outward of the optical axis of the projection system PS. The liquidphobic (e.g., hydrophobic) coating helps keep the immersion liquid in the space 11.

The examples of FIGS. 5 and 6 are a so called localized area arrangement in which liquid is only provided to a localized area of the top surface of the substrate W at any one time. Other arrangements are possible, including fluid handling systems which make use of a gas drag principle. The so-called gas drag principle has been described, for example, in United States patent application publication no. US 2008-0212046 and United States patent application publication nos. US 2009-0279060 and US 2009-0279062. In that system the extraction holes are arranged in a shape which desirably has a corner. The corner may be aligned with the stepping and scanning directions. This reduces the force on the meniscus between two openings in the surface of the fluid handing structure for a given speed in the step or scan direction compared to if the two outlets were aligned perpendicular to the direction of scan. An embodiment of the invention may be applied to a fluid handling structure used in all wet immersion apparatus. In the all wet embodiment, fluid is allowed to cover the whole of the top surface of the substrate table, for example, by allowing liquid to leak out of a confinement structure which confines liquid to between the final element of projection system and the substrate. An example of a fluid handling structure for an all wet embodiment can be found in United States patent application publication no. US 2010-0060868.

As will be appreciated, any of the above described features can be used with any other feature and it is not only those combinations explicitly described which are covered in this application.

There may be one or more conduits which have two phase flow in them in an immersion apparatus. Some examples are given below with reference to FIG. 8. It can be desirable to measure the flow in such a conduit. For example measuring the flow can lead to a confirmation that a pump causing flow of fluid in the conduit is functioning. It may be desirable to measure the gas-liquid ratio in the two phase flow. For example, depending on the gas-liquid ratio, different flow regimes can occur, each with a different range of frequencies at which disturbances occur. (For example, slug flow has a different range of disturbances than, for example, mist flow). Furthermore, different gas-liquid ratios can lead to different thermal loads being applied to components. Therefore, it is desirable to be able to measure the gas-liquid ratio in two phase flow.

Information about the two phase flow may be used to take action to optimize or improve performance of the apparatus. For example, it may be necessary to vary the flow out of or into an outlet in order to achieve a desired result. As an example, it may be desirable to achieve a gas flow rate into a conduit for two phase flow which is equal to the gas flow out of an adjacent conduit. In an embodiment it may be desirable to achieve a certain gas-liquid ratio in the two phase flow.

Figure 7:
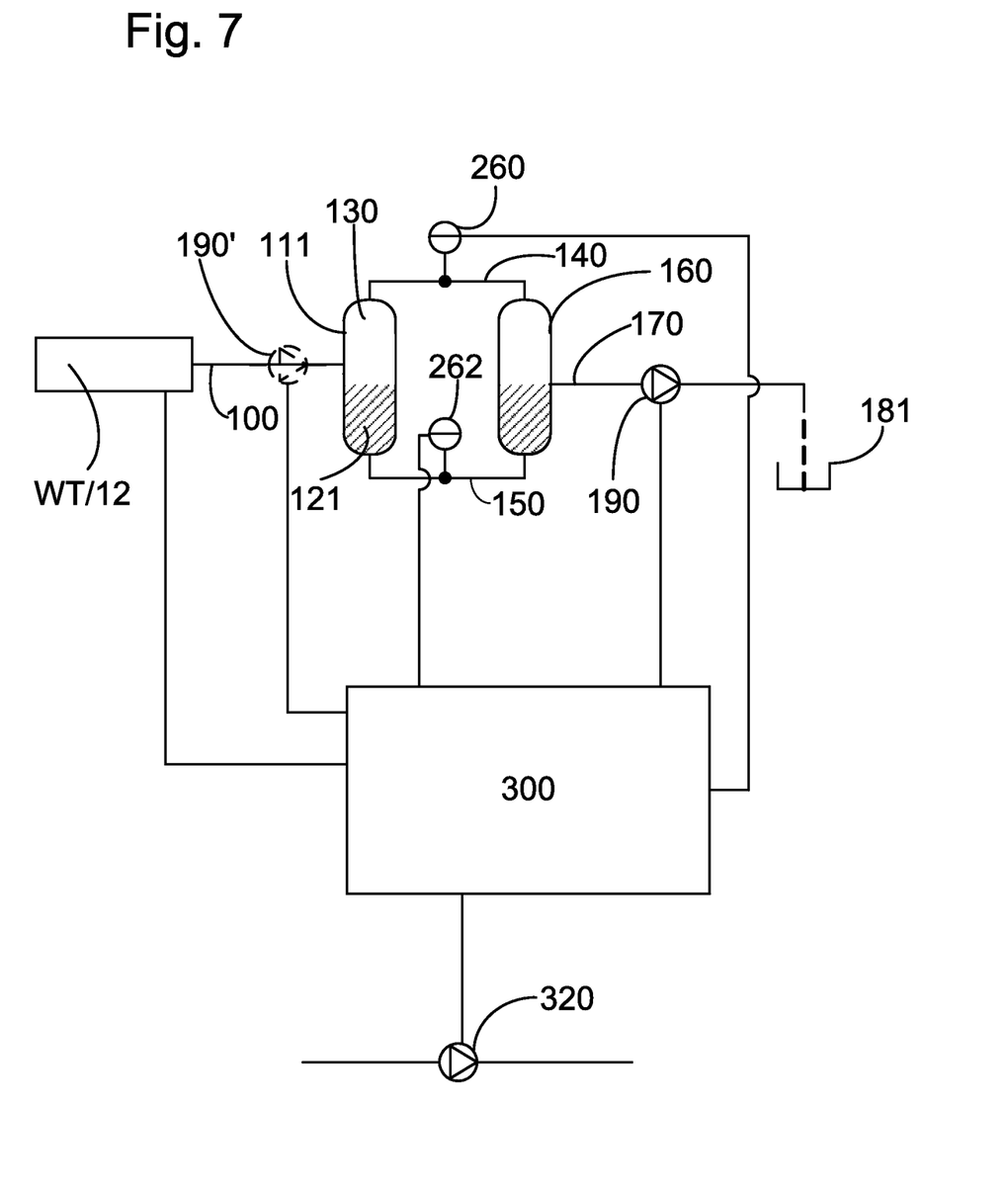
FIG. 7 depicts schematically a system to measure a flow rate in a two phase flow.

An embodiment of the present invention is directed at one or more of the above problems, or other problems not mentioned herein. An embodiment of the invention is schematically illustrated in FIG. 7. A conduit 100 in which two phase flow exists may be part of a substrate table WT or a liquid confinement structure 12, as described below with reference to FIGS. 6 and 8. The flow of liquid and gas in the conduit 100 is separated by a flow separator into a gas flow and a liquid flow. As illustrated in FIG. 7, in one embodiment the flow separator may be include a separation chamber 111. As two phase flow flows into the separation chamber 111 from the conduit 100, liquid 121 drops to the bottom of the separation chamber 111 and gas 130 is present at the top of the separation chamber 111. A gas conduit 140 exits the top of the separation chamber 111. Thereby substantially only gas flow is present in gas conduit 140. A liquid conduit 150 is attached to the bottom of the separation chamber 111 and thereby substantially only liquid flow in it.

The gas conduit 140 and liquid conduit 150 are both connected to a re-combining chamber 160 and two phase flow is extracted out of the re-combining chamber throughout outlet conduit 170. Outlet conduit 170 provides the two phase flow to a drain 181 at which point the liquid may be recycled or disposed of, as appropriate.

A pump 190 may be provided downstream of the re-combining chamber 160. The pump 190 is configured to draw the fluid or push the fluid through the conduits and chambers. The flow of gas into separation chamber 111 will equal the flow of gas out of re-combining chamber 160. The flow of liquid into separation chamber 111 will equal the flow of liquid out of re-combining chamber 160. Therefore, the flow rate of gas in gas conduit 140 will be equal to the flow rate of gas in the two phase flow in the conduit 100. Therefore, by positioning a first flow meter 260 to measure flow of gas in the gas conduit 140, the reading of the first flow meter 260 will be equal to the flow of gas in the conduit 100. Similarly, a second flow meter 262 can be provided to measure the flow of liquid in the liquid conduit 150. The reading of the second flow meter 262 will be equal to the flow rate of liquid in the conduit 100.

Although the pump 190 is illustrated downstream of the re-combining chamber 160 in FIG. 7, the pump could be provided instead or additionally upstream of the separation chamber 111 as illustrated in dashed lines and indicated with reference numeral 190'. Additionally, instead of a pump 190, 190', the item 190, 190' could be a flow rate or pressure adjusting device (e.g. a regulated valve) if the end of outlet conduit 170 is kept at an under pressure relative to conduit 100.

The system illustrated in FIG. 7 can be used without re-combining the two flows in re-combining chamber 160, particularly if pump 190' is used and separation chamber 111 always contains some liquid. Instead, the gas conduit 140 and liquid conduit 150 could lead directly to one or more drains.

A controller 300 may be provided. The first and second flow meters 260, 262 may provide signals to the controller 300 indicative of the flow rates measured. On the basis of one or both of the signals, the controller 300 can be used to vary at least one parameter of the apparatus.

For example, the controller 300 could vary the parameter of flow rate through at least one pump of the apparatus. As illustrated in FIG. 7 this may be the flow rate of pump 190 in outlet conduit 170 and/or of pump 190' in conduit 100. In an embodiment the controller 300 may vary the flow rate through a flow rate or pressure adjusting device (e.g. a (regulated) valve) or a further pump 320. The flow rate or pressure adjusting device or further pump 320 could be part of an extraction system configured to extract gas or liquid or both or be part of a providing system configured to provide liquid or gas or both.

In an embodiment the controller 300 may control a parameter of the substrate table WT and/or liquid confinement structure 12. For example, the controller 300 could vary the relative position of the substrate table WT and liquid confinement structure 12 thereby to vary the distance between those two components.

The controller 300 could adjust the parameter dependent upon the magnitude of fluid flow measured by the first flow meter 260 or the second flow meter 262 or both. Alternatively or additionally the controller 300 could adjust the parameter dependent upon the ratio of the magnitude of flow of fluid in the gas flow measured by the first flow meter 260 to the flow of fluid in the liquid flow measured by the second flow meter 262 and/or the ratio of the flow of fluid in the liquid flow measured by the second flow meter 262 to the magnitude of flow of fluid in the gas flow measured by the first flow meter 260. In an embodiment the parameter could be adjusted with the aim of maintaining the magnitude of flow of gas or liquid or both or the gas-liquid ratio to be at a certain desired (e.g., pre-determined) level.

The controller 300 may determine the variation in parameter based on the change in flow rate of gas, or change in flow rate of liquid, or change in flow rate of both gas or liquid or change in gas-liquid ratio over time. For example, the controller may vary at least one parameter in order to maintain any of those conditions substantially constant (e.g. at a pre-determined level) over time.

Uses of the system or parts of the system of FIG. 7 will now be described in several examples. In these examples items 320, 321, 322, 323, 324, 325 and 410 are referred to as pumps. However, these items could alternatively be flow rate or pressure adjusting devices (e.g. a regulated valve). For example they could vary flow through them to a low pressure source (e.g. 321, 322, 323, 324, 325) or from a high pressure source (e.g. 410).

In one embodiment the system or parts of the system of FIG. 7 can be used to mitigate against the chance of liquid spillage occurring on failure of a pump. For example, failure of a pump which creates an under pressure in chamber 120 of FIG. 6 or of a pump attached to an opening of an extractor in a so called gas drag principle arrangement could lead to immersion liquid being spilled on the substrate table WT. Fast detection of such a failure is therefore desirable to prevent downtime of the apparatus. If such a failure is detected, a parameter, such as the flow rate of a pump providing liquid to the space 11 and/or of a pump providing liquid to a gap between the liquid confinement structure 12 and the substrate W, could be adjusted (e.g. reduced to zero).

Using a pressure sensor in the conduit 100 to measure such failure is not reliable because based on pressure alone it is difficult to distinguish between the pump not functioning or the pump only pumping gas. That is, a pressure sensor is sensitive to the exact gas-liquid ratio that is being pumped. Similarly, a flow meter used to detect the two phase flow in conduit 100 (such as an impulse flow meter and/or a heat-loss based flow meter) has difficulties due to the large differences in the properties of gas and liquid.

Use of the system of FIG. 7 allows the gas flow rate and/or liquid flow rate to be measured and thereby correct functioning or otherwise of the pump 190 or 190' to be detected. If a malfunction is detected, the controller 300 may take remedial action. For example, the controller 300 may try to direct pumps 190 or 190' to increase extraction. Alternatively or additionally, the controller 300 may direct a pump 320 which provides liquid to the space 11 or to between the liquid confinement structure 12 and the substrate through opening 180 to be switched off. This can reduce the chance of leakage of liquid in the event of pump failure.

Figure 8:
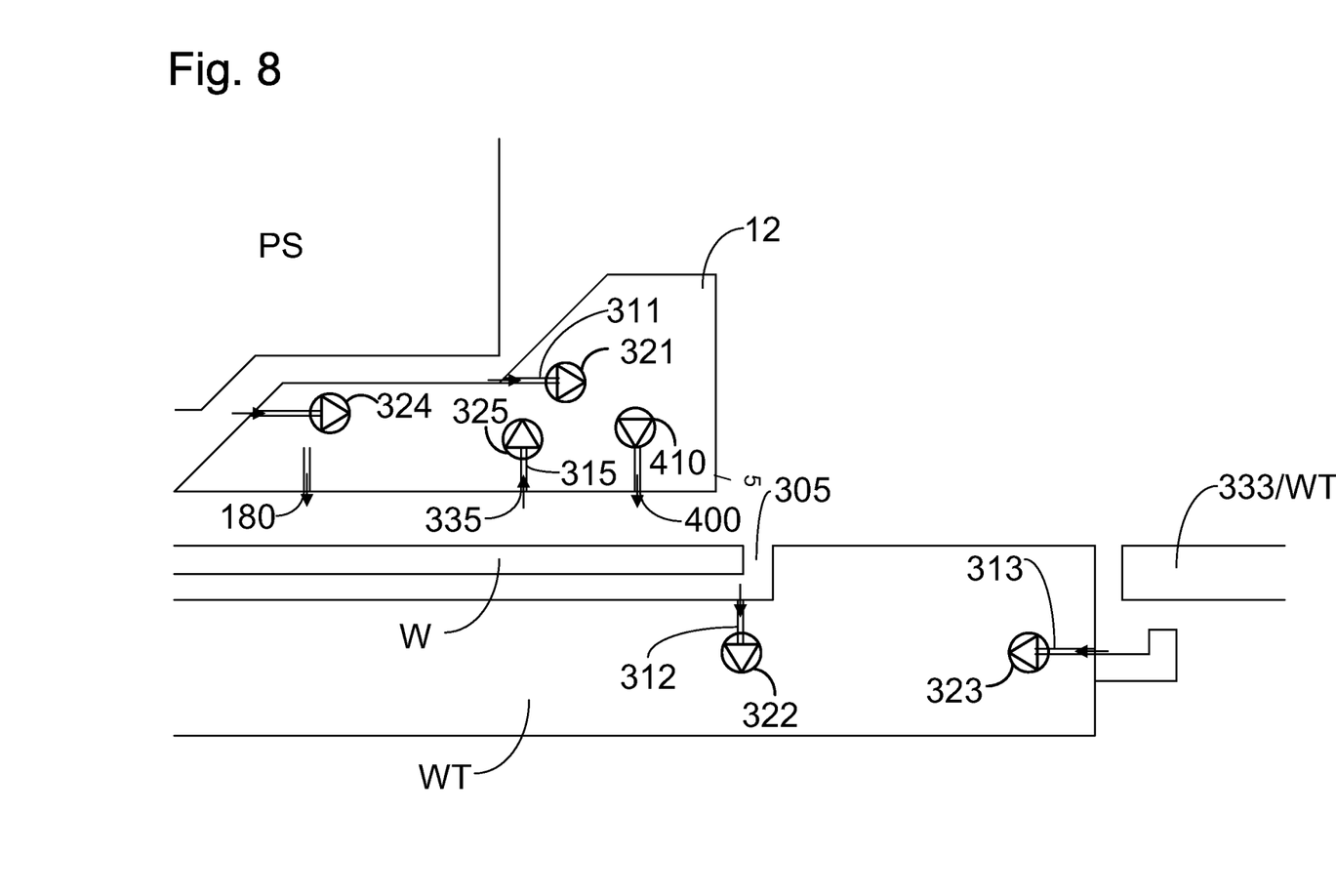
FIG. 8 illustrates, in cross-section, a liquid confinement structure and a substrate table to which an embodiment of the present invention may be applied.

The same principles as applied to the pumps attached to chamber 120 in FIG. 6 and to openings of a gas drag principle liquid confinement structure can also be applied to other areas. Further examples are illustrated in FIG. 8 which illustrates the projection system PS, gas-drag principle liquid confinement structure 12 and substrate table WT. The examples include a conduit 311 and pump 321 for the extraction of liquid from a top surface of the liquid confinement structure 12. Such a conduit 311 and pump 312 are provided to remove excess liquid which can otherwise overflow over the liquid confinement structure 12. Another example is an extractor in the substrate table WT which comprises a conduit 312 positioned under an edge of the substrate W and a pump 322 to extract liquid which leaks in a gap 305 between the edge of the substrate W and the edge of a recess in the substrate table WT in which the substrate W lies. Another example is an extractor comprising a conduit 313 and pump 323 at the edge of a substrate table WT. This may be positioned to catch liquid which escapes between an edge of the substrate table WT and the edge of a second substrate table WT or a bridge 333 which is positioned between the first substrate table WT and the second substrate table WT. U.S. patent application publication no. US 2009-0296065 discloses details of such an extractor for immersion liquid which escapes between a gap between two substrate tables and/or a substrate table and a bridge 333 to another substrate table. The principles described above in relation to FIG. 7 could be applied to the pump 323 of such an extractor. The same principles could be applied to an extractor for extracting immersion liquid from the space 11 between the final element of the projection system and the substrate W. The pump 324 of such an extractor could be monitored in the same way as described above in relation to other types of extractor. Another extractor which could benefit from failure detection illustrated in FIG. 8 is an opening 335, associated conduit 315 and pump 325 of a so called gas drag principle extractor.

One or more of the extractors mentioned above may be uncontrolled and simply run at maximum speed. This can cause difficulty because the proportion of gas they extract can vary with time. This can result in a different heat load being applied by the two phase fluid flow along the associated conduit. An embodiment of the invention can be used to measure the ratio of gas-liquid flow from knowledge of the magnitude of the two flows or knowledge of the magnitude of one flow and the volume flow rate of the pump, for example. The controller 300 can then control the associated pump to vary the flow of two phase fluid through that pump and thereby vary the gas-liquid ratio in the two phase flow. For example, if the ratio of gas flow to liquid flow is too high (i.e. too much gas), the flow rate of the associated pump can be decreased because the significant part for the correct functioning of an extractor is the amount of liquid being extracted, not the amount of gas. The high ratio indicates that the pump is working harder than it needs to remove the amount of liquid arriving at the opening of the extractor. By decreasing the flow rate of the pump, the flow rate of liquid can be maintained (i.e. all the liquid arriving at the extractor can be removed) but the flow rate of gas is reduced thereby resulting in a decrease in the ratio of gas to liquid in the two phase flow (i.e. an increase in the proportion of liquid).

A particular example of this is the extraction pump 325 configured to extract liquid from the gap between the liquid confinement structure 12 and the substrate W. If, for example, the ratio of gas to liquid is too high the pump frequency can be lowered thereby decreasing the total volume extracted by the pump as well as increasing the lifetime of the pump. The ratio of gas to liquid will then decrease. The cooling load applied by the flow to the liquid confinement structure 12 by evaporation is thereby decreased.

Measurement of the gas-liquid ratio or just the amount of liquid or just the amount of gas being extracted by the extraction pump 325 can be used by controller 300 to vary at least one parameter. The parameter may be selected from: the extraction rate of extraction pump 325, the rate of gas provided through outlet 400, the rate of liquid provided through outlet 180 and/or the distance between the liquid confinement structure 12 and the top surface of the substrate W. The ratio of gas to liquid being extracted by pump 325 has an effect on the force between the liquid confinement structure 12 and the substrate table WT. The controller 300 can be used to keep the ratio substantially constant. This does not necessarily mean constant force unless the magnitude of the flows stays the same. If the ratio of gas to liquid is too low (too much liquid) the gas flow rate out of opening 400 (e.g. a gas knife) may be increased so that more gas is extracted by extraction pump 325. Additionally or alternatively, the flow through opening 335 may need to be increased. Alternatively or additionally, the flow of liquid out of opening 180 may be decreased, thereby to decrease the amount of liquid extracted by extraction pump 325. Alternatively or additionally, the distance between the liquid confinement structure 12 and the substrate table WT may be varied to have the same or a similar effect.

In U.S. patent application No. 61/181,158, filed on 25 May 2009, the idea of balancing the flow rate of gas out of outlet(s) 400 with the flow rate of gas into the opening(s) 335 connected to the flow extraction pump 325 is suggested. In this system substantially all of the gas exiting the liquid confinement structure 12 out of outlet 400 is extracted through the liquid confinement structure 12 through the opening 335 connected to the extraction pump 325. Using the system of FIG. 7 the flow rate of gas out of the outlet 400 and/or the flow rate of gas into the opening 335 connected to the extraction pump 325 can be varied. That is, either or both of the pumps 325, 410 can be controlled by the controller 300 to achieve the desired balance. In this embodiment, the pump 410 is desirably a flow rate or pressure adjusting device as suggested above.

In one embodiment the flow rate of gas out of outlet 400 is kept constant (constant mass flow) by maintaining the pump 410 at a constant flow of volume. The controller 300 can then vary the pump 325 to achieve a flow rate of gas into the opening 335 which is equal to the flow rate of gas out of opening 400. Alternatively the flow rate of the pump 325 can be kept constant and the pump 410 (and optionally one or more further pumps such as a pump connected to opening 180) can be varied to balance the flow rate out of opening 400 and into the opening 335. In an embodiment the gas flow into the opening 335 can be measured (with the volume flow of pump 325 not necessarily fixed) and the gas flow through the opening 400 can be controlled by varying the frequency of the pump 410.

In an embodiment the first and second flow meters 260, 262 measure the flow rate through the conduit 100 (which is an extraction conduit) of fluid, i.e. gas, liquid or both. The extraction conduit 100 may have a controller 300 to control the flow of fluid (i.e. gas, liquid or both) through the extraction conduit 100, from one or more extraction openings (e.g. 335) which may be formed in the surface of the liquid confinement structure 12.

In an embodiment, the liquid confinement structure 12 comprises a gas knife with an opening 400 located near by the two phase fluid extraction opening 335. The gas flow through the gas knife may be sensed using a gas flow sensor. The flow through the gas knife opening 400 may be controlled by a controller 300. The controller 300 may control the gas knife flow and/or the extraction flow so as to balance the flow through the gas knife and the extraction conduit 100 or at least so that the flow rates are within a certain flow rate difference. The flow rate difference may be less than 20, 10 or even 5 percent of either flow rate.

There is a flow rate mismatch if the difference is more than a certain flow rate difference. In the flow regime of a flow rate mismatch flow control performance and performance of the liquid confinement structure 12 may deteriorate below a certain performance standard. On detection of a flow rate mismatch, the controller 300 generates a signal. The signal may be directed to a user, for example as a warning signal. The signal may be directed to the flow rate controller 300 which in response to the signal reduces the flow rate difference below the certain flow rate difference. In an embodiment the flow rate controller 300 operates to adjust a flow rate while the liquid confinement structure 12 is still operating. System performance is thereby restored.

In any of the above described embodiments, the pumps may be volume flow pumps.

In any of the above described embodiments, the controller 300 may allow for user control. For example, the controller 300 can indicate certain parameters such as gas flow rate, liquid flow rate and gas-liquid ratio and allow a user to vary operating parameters manually.

In an aspect, there is provided a lithographic apparatus comprising: a conduit for two phase flow therethrough; a flow separator for separating the two phase flow into a gas flow and a liquid flow; and a first flow meter for measuring the flow rate of fluid in the gas flow or the liquid flow. Desirably the apparatus further comprises a second flow meter for measuring the flow rate of fluid in the other of the gas flow and liquid flow. Desirably the apparatus further comprises a controller for controlling at least one parameter of the apparatus dependent upon the fluid flow rate measured by the first flow meter and/or the second flow meter. Desirably the controller is adapted to adjust the parameter dependent upon the magnitude of fluid flow measured by the first flow meter, or the second flow meter, or both. Desirably the controller is configured to control the parameter dependent on the ratio of the magnitude of the flow of fluid in the gas flow to the flow of fluid in the liquid flow or the ratio of the magnitude of the flow of fluid in the liquid flow to the flow of fluid in the gas flow. Desirably the at least one parameter of the apparatus is controlled based on the magnitude of the measured flow rate over time, desirably the at least one parameter includes a flow rate through at least one flow rate or pressure adjusting device or fluid pump. Desirably the at least one flow rate or pressure adjusting device or fluid pump includes a flow rate or pressure adjusting device or fluid pump for varying fluid flow through the conduit. Desirably the at least one flow rate or pressure adjusting device or fluid pump includes a flow rate or pressure adjusting device or fluid pump for varying fluid flow into a gap between a liquid confinement structure and a substrate. Desirably the flow rate or pressure adjusting device or fluid pump for varying fluid flow into a gap is a flow rate or pressure adjusting device or fluid pump for varying gas flow into the gap. Desirably the flow rate or pressure adjusting device or fluid pump for varying fluid flow into the gap is a flow rate or pressure adjusting device or fluid pump for varying liquid flow into the gap. Desirably the controller is configured so that the at least one parameter is controlled such that the flow rate through the at least one flow rate or pressure adjusting device or fluid pump is substantially the same as the flow rate measured by the first flow meter. Desirably the controller is configured such that the at least one parameter is controlled so that the flow rate measured by the first flow meter is substantially a pre-determined flow rate. Desirably the apparatus further comprises a further conduit, a further flow rate or pressure adjusting device or fluid pump and the controller controls the further flow rate or pressure adjusting device or fluid pump such that the flow rate of fluid through the further conduit is substantially constant at a pre-determined rate. Desirably the at least one parameter includes a distance between a substrate and a liquid confinement structure for confining liquid to a space between a projection system and the substrate, desirably the at least one parameter includes a parameter which is adjusted to mitigate against liquid spillage in case of failure of a component for drawing two phase flow through the conduit. Desirably the flow separator comprises a separation chamber, desirably a re-combining chamber is provided in which the separated gas flow and liquid flow are re-combined. Desirably the conduit starts at an opening in a liquid confinement structure. Desirably the opening is in a surface defining a space to which the liquid confinement structure confines liquid, wherein the space is between the projection system and the substrate. Desirably the opening is in an undersurface of the liquid confinement structure which, in use, faces a substrate. Desirably in use, liquid and gas are extracted through the opening from between the liquid confinement structure and the substrate. Desirably the opening is covered with a porous member. Desirably the opening is formed in an upper surface of the liquid confinement structure. Desirably the conduit starts at an opening in a surface of a substrate table for supporting a substrate. Desirably the opening is for the extraction therethrough of liquid which passes through a gap between an edge of a substrate and the substrate table on which the substrate is supported. Desirably the opening is for the extraction therethrough of liquid which passes through a gap between an edge of the substrate table and an edge of a second substrate table or a bridge positioned between the first substrate table and a second substrate table.

In an aspect there is provided a method of measuring flow rate in a two phase flow comprising: separating a two phase flow into a gas flow and a liquid flow; and using a first flow meter to measure flow rate of fluid in the gas flow or the liquid flow. Desirably the method further comprises using a second flow meter to measure flow rate of fluid in the other of the gas flow and the liquid flow. Desirably the method further comprises varying at least one parameter of an apparatus in which the two phase flow is flowing dependent upon the fluid flow rate measured by the first flow meter and/or second flow meter. Desirably the parameter varied includes a flow rate through at least one flow rate or pressure adjusting device or fluid pump. Desirably the at least one flow rate or pressuring adjusting device or fluid pump is used to vary fluid flow through the conduit in which the two phase flow is flowing. Desirably the at least one parameter varied includes a flow rate of fluid into a gap between a liquid confinement structure and a substrate. Desirably the at least one parameter varied includes a flow of gas into a gap between a liquid confinement structure and a substrate.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media. The controllers described above may have any suitable configuration for receiving, processing, and sending signals. For example, each controller may include one or more processors for executing the computer programs that include machine-readable instructions for the methods described above. The controllers may include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

Moreover, although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. For example, it is contemplated that various combination or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above, but should be determined only by a fair reading of the claims that follow.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a conduit for two phase flow therethrough;
   a flow separator configured to separate the two phase flow into a gas flow and a liquid flow;
   a first flow meter configured to measure the flow rate of fluid in the gas flow or the liquid flow; and
   a controller configured to control a flow rate through at least one flow rate or pressure adjusting device or fluid pump configured to vary fluid flow through the conduit, dependent upon the fluid flow rate measured by the first flow meter.

2. The lithographic apparatus of claim 1, wherein the first flow meter is configured to measure the flow rate of fluid in the gas flow and further comprising a second flow meter configured to measure the flow rate of fluid in the liquid flow.

3. The lithographic apparatus of claim 1, wherein the controller is configured to adjust the flow rate dependent upon the magnitude of fluid flow measured by the first flow meter.

4. The lithographic apparatus of claim 1, wherein the controller is configured to control the flow rate dependent on the ratio of the magnitude of the flow of fluid in the gas flow to the flow of fluid in the liquid flow, or the ratio of the magnitude of the flow of fluid in the liquid flow to the flow of fluid in the gas flow.

5. The lithographic apparatus of claim 1, wherein the flow rate is controlled based on the magnitude of the measured flow rate over time.

6. The lithographic apparatus of claim 1, wherein the at least one flow rate or pressure adjusting device or fluid pump includes a flow rate or pressure adjusting device or fluid pump configured to vary fluid flow into a gap between a liquid confinement structure and a substrate.

7. The lithographic apparatus of claim 6, wherein the flow rate or pressure adjusting device or fluid pump configured to vary fluid flow into a gap is a flow rate or pressure adjusting device or fluid pump configured to vary gas flow into the gap.

8. The lithographic apparatus of claim 6, wherein the flow rate or pressure adjusting device or fluid pump configured to vary fluid flow into the gap is a flow rate or pressure adjusting device or fluid pump configured to vary liquid flow into the gap.

9. The lithographic apparatus of claim 1, wherein the controller is configured such that the flow rate is controlled so that the flow rate through the at least one flow rate or pressure adjusting device or fluid pump is substantially the same as the flow rate measured by the first flow meter.

10. The lithographic apparatus of claim 1, wherein the controller is configured such that the flow rate is controlled so that the flow rate measured by the first flow meter is substantially a pre-determined flow rate.

11. The lithographic apparatus of claim 10, further comprising a further conduit, a further flow rate or pressure adjusting device or fluid pump and wherein the controller is configured to control the further flow rate or pressure adjusting device or fluid pump such that the flow rate of fluid through the further conduit is substantially constant at a pre-determined rate.

12. The lithographic apparatus of claim 1, wherein the controller is further configured to control a distance between a substrate and a liquid confinement structure configured to confine liquid to a space between a projection system and the substrate dependent upon the fluid flow rate measured by the first flow meter.

13. The lithographic apparatus of claim 1, wherein the controller is configured to control the flow rate to mitigate against liquid spillage in case of failure of a component configured to draw two phase flow through the conduit.

* * * * *